(12) United States Patent
Nardi

(10) Patent No.: US 11,948,630 B2
(45) Date of Patent: Apr. 2, 2024

(54) TWO-TERMINAL ONE-TIME PROGRAMMABLE FUSES FOR MEMORY CELLS

(71) Applicant: Applied Materials, Inc., Santa Clara, CA (US)

(72) Inventor: Federico Nardi, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/518,937

(22) Filed: Nov. 4, 2021

(65) Prior Publication Data

US 2023/0134437 A1 May 4, 2023

(51) Int. Cl.
  *G11C 11/56* (2006.01)
  *G11C 17/16* (2006.01)
  *G11C 17/18* (2006.01)

(52) U.S. Cl.
  CPC ...... *G11C 11/5678* (2013.01); *G11C 11/5628* (2013.01); *G11C 11/5642* (2013.01); *G11C 17/16* (2013.01); *G11C 17/18* (2013.01)

(58) Field of Classification Search
  CPC ............ G11C 11/5678; G11C 11/5628; G11C 11/5642; G11C 17/16; G11C 17/18
  See application file for complete search history.

(56) References Cited

U.S. PATENT DOCUMENTS

| 6,580,144 B2 * | 6/2003 | Anthony | H01L 23/5252 257/E27.071 |
| 8,659,931 B1 * | 2/2014 | Ertosun | G11C 13/0097 365/163 |
| 2003/0031074 A1 * | 2/2003 | Tran | G11C 17/16 257/E23.149 |
| 2003/0062590 A1 * | 4/2003 | Anthony | H01L 21/76838 257/E21.585 |
| 2003/0062595 A1 * | 4/2003 | Anthony | H01L 23/5256 257/E27.071 |
| 2014/0126266 A1 * | 5/2014 | Chung | G11C 8/14 365/96 |
| 2017/0032848 A1 * | 2/2017 | Chung | G11C 17/18 |

* cited by examiner

*Primary Examiner* — Khamdan N. Alrobaie
(74) *Attorney, Agent, or Firm* — Kilpatrick Townsend & Stockton LLP

(57) ABSTRACT

Memory cells in a memory array may be configured to include a fuse that will blow in the case of a defective cell. In a 1T-1R memory cell, a fuse may be placed in series with the select element and/or the memory element to counteract a short-circuit in either of these elements. A fuse may be formed by selectively etching a phase-change material (PCM) between two electrodes to leave a cavity. When sufficient energy is applied to the PCM material, the PCM filament will break its crystalline structure and be distributed within the cavity. This prevents the PCM material from recrystallizing. Another fuse may be formed by depositing a material between two electrodes that is doped with mobile ions. When subjected to an excessive signal, the resulting electric field may push these ions permanently towards one of the electrodes, thereby permanently destroying the conductive pathway.

20 Claims, 11 Drawing Sheets

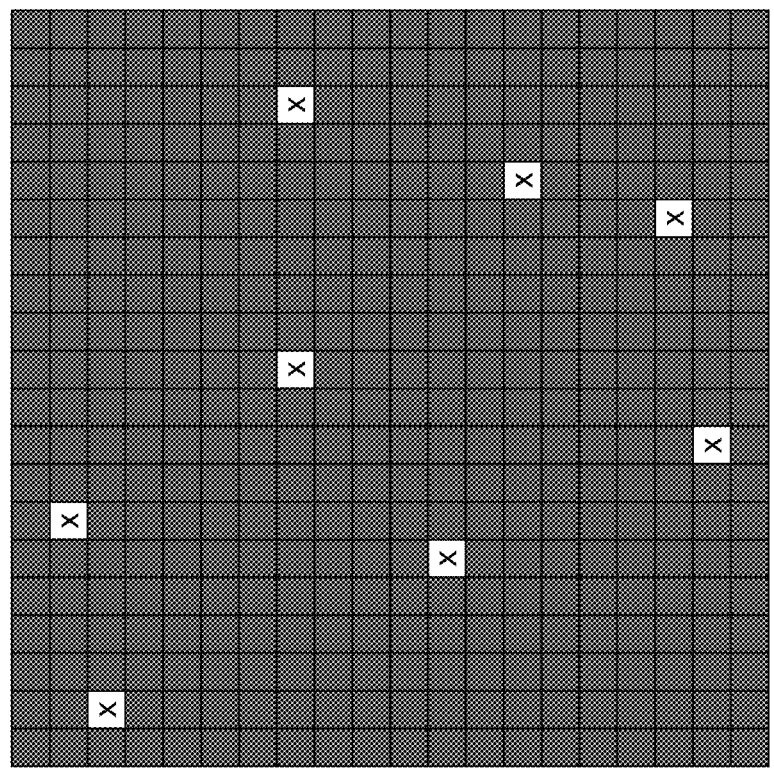
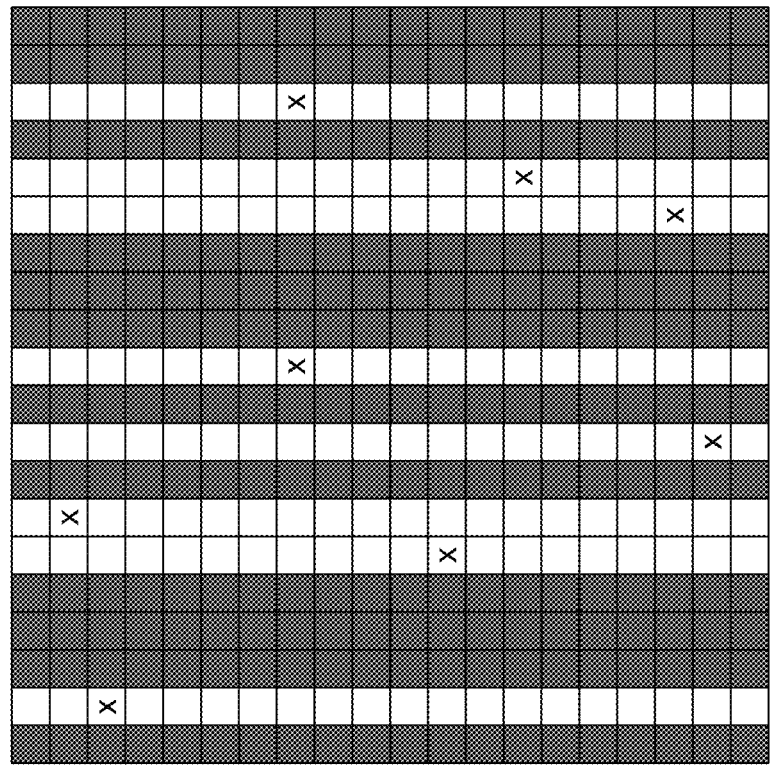
FIG. 3B
FIG. 3A

TWO-TERMINAL ONE-TIME PROGRAMMABLE FUSES FOR MEMORY CELLS

TECHNICAL FIELD

This disclosure generally describes two-terminal, one-time programmable fuses that may be used in memory arrays and other applications. More specifically, this disclosure describes a selectively etched phase-change material fuse and an ion-doped fuse that may be used in individual 1T-1R memory cells.

BACKGROUND

A One-Time Programmable (OTP) device is intended to be programmed a single time to permanently set the state of the device. After programming the state, the OTP device may be repeatedly read an indefinite number of times. OTP devices have uses in many applications. For example, OTP devices may store configuration data for memory arrays or processors. OTP devices may also be used to customize integrated circuits after fabrication in order to store device IDs, security information, firmware, and other permanent data.

Conventional methods of programming OTP devices usually involve permanently changing a physical aspect of the OTP device. For example, a fuse is a type of OTP device that operates by physically disrupting a conductive path through the device to permanently alter the conductive pathway through the device and increase the resistance through the device. Ideally, the OTP device should maintain its programmed state indefinitely, thereby allowing the OTP device to be read an infinite number of times without changing its state.

SUMMARY

In some embodiments, a memory cell in a memory array may include a memory element configured to store a value; a select element in series with the memory element configured to receive a select signal for the memory cell to read and/or write the memory element; and a one-time programmable fuse in series with the memory element or the select element.

In any embodiments, any and all of the following features may be implemented in any combination and without limitation. The fuse may be configured to generate an open circuit in response to a short circuit in the select element or the memory element. The memory array may include a plurality of memory cells, and each of the plurality of memory cells may include one-time programmable fuses. The memory element may include a defect causing the memory element to short-circuit, and other memory elements in a same memory column of the memory array remain operational. The fuse may be between approximately 20 nm to 100 nm wide.

In some embodiments, a two-terminal, one-time programmable fuse may include a first electrode; a second electrode; and an isolator material formed around the first electrode and the second electrode. The fuse may also include a phase-change material (PCM) layer between the first electrode and the second electrode. A width of the PCM layer may be less than a width of the first electrode and the second electrode such that a cavity is formed between the isolator material and the PCM layer between the first electrode and the second electrode.

In any embodiments, any and all of the following features may be implemented in any combination and without limitation. The PCM layer may include a chalcogenide material. The chalcogenide material may include a composition of Germanium-Antimony-Telluride. A width of the PCM layer may be less than a distance between the PCM layer and the isolator material. The isolator material may include an oxide. The PCM material may include a selectively-etched PCM material underneath the second electrode. The PCM material may include a crystalline structure that forms a conductive filament between the first electrode and the second electrode. A width of the PCM material may be sized based on a threshold voltage or current, such that the conductive filament may disperse within the cavity upon application of the threshold voltage or current.

In some embodiments, a two-terminal, one-time programmable fuse may include a first electrode; a second electrode; and a doped material between the first electrode and the second electrode. The doped material may be doped with mobile ions.

In any embodiments, any and all of the following features may be implemented in any combination and without limitation. The doped material may include an oxide. The doped material may include a chalcogenide material. The mobile ions may include copper ions. The mobile ions may be evenly distributed throughout the doped material. The mobile ions may form a conductive pathway through the doped material. The mobile ions may be concentrated near the first electrode in response to a previous application of an electric field.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

FIG. 3A illustrates a traditional memory array with defective memory cells, according to some embodiments.

FIG. 3B illustrates a memory array where fuses are included in the individual memory cells, according to some embodiments.

DETAILED DESCRIPTION

When single memory cells in large memory arrays become defective, it can cause an entire column of memory cells in the array to become unusable. To isolate defects to a single memory cell, each memory cell may be configured to include a fuse that will blow in the case of a defective cell. For example, in a 1-transistor 1-resistor memory cell, a fuse may be placed in series with the select element and/or the memory element to counteract a short-circuit in either of these elements. Special fuses may be used that can accommodate the low-power and small-area requirements of memory cells and other similar semiconductor applications. For example, a fuse may be formed by selectively etching a phase-change material (PCM) between two electrodes to leave a cavity around the PCM material. When sufficient energy is applied to the PCM material, the filament will break its crystalline structure and be distributed within the cavity. This prevents the PCM material from recrystallizing to form a conductive pathway after it is destroyed. Another type of fuse may be formed by depositing a material between two electrodes that is doped with mobile metallic ions. During normal operation, these ions may form a conductive pathway through the material. However, when subjected to an excessive voltage/current, the resulting electric field may push these ions permanently towards one of the electrodes, thereby destroying the conductive pathway and opening the fuse.

Figure 1:
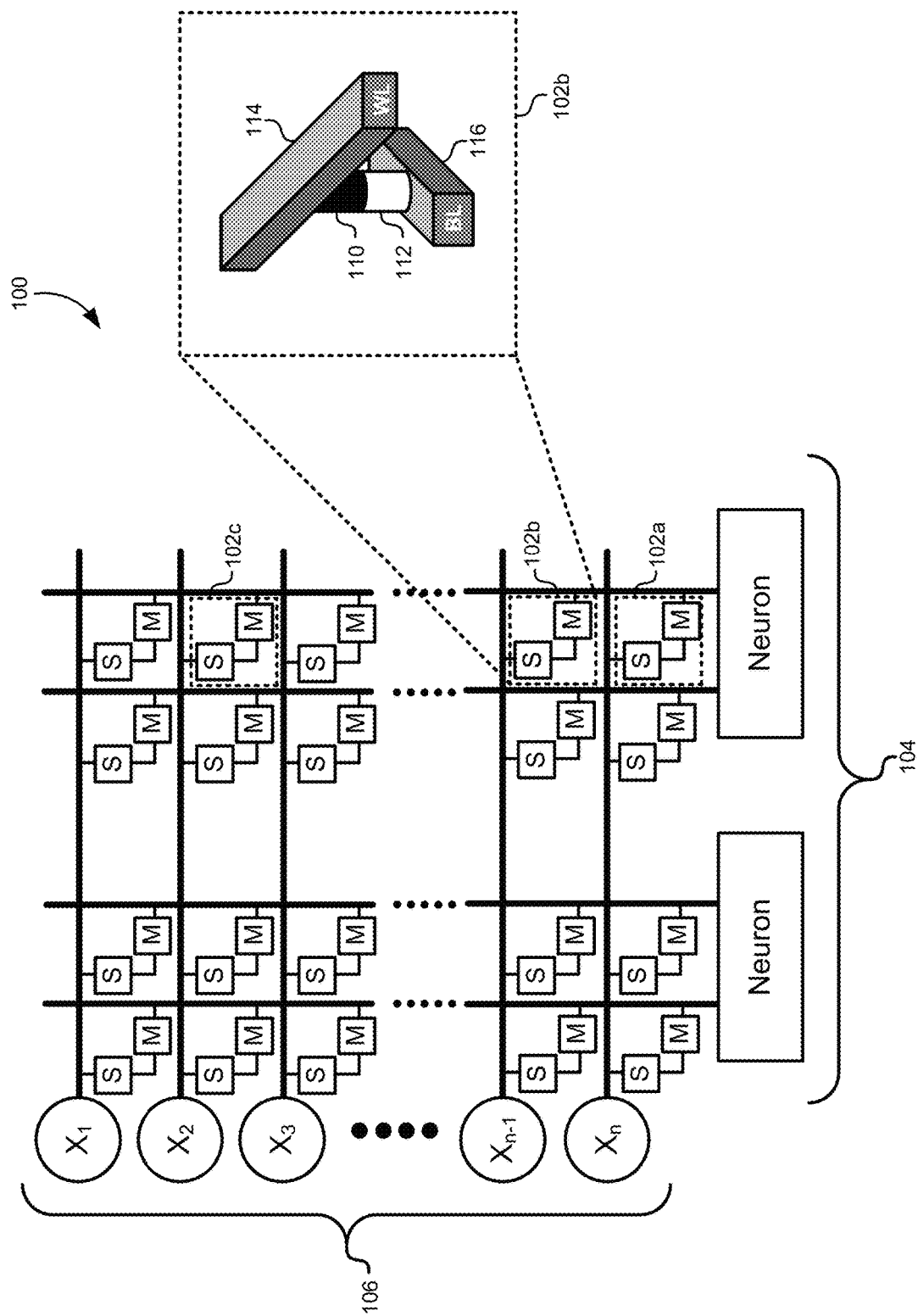
FIG. 1 illustrates a circuit network that implements a neural network, according to some embodiments.

FIG. 1 illustrates a circuit network 100 that implements a neural network, according to some embodiments. While the embodiments described herein may be used in any type of circuit, the circuit network 100 implementing a neural network represents one practical application of these embodiments. However, this neural network application is provided only by way of example and is not meant to be limiting.

FIG. 1 represents a simplified view of a simple neural network where many connections and/or hidden layers may have been omitted for the sake of clearly describing the various circuit components that can be used to represent neurons and synapses. The circuit network 100 includes a plurality of inputs 106 that may be connected to a plurality of devices representing neurons 104 through memory cells 102 representing synapses.

In some embodiments, the synapses may be represented by individual two-terminal memory elements. When using memory devices to model synapses, the circuit network 100 may be viewed as a form of non-volatile memory array. Each of the memory cells 102 representing synapses may be arranged in a rectangular grid pattern. In some embodiments, the grid pattern may be three-dimensional such that multiple grids lie above and below each other, as in a crosspoint memory array. Each of the memory elements may be configured to receive an applied voltage, and based on the polarity of the applied voltage, the memory cells representing the synapses may change a physical state of a material in the memory element to represent a saved logic state, such as a logic 1 and a logic 0. When the voltage is no longer applied, the memory cells 102 may save the logic state induced by the applied voltage, and thus may operate as non-volatile memory elements.

In order to apply the voltage needed to read/write to the memory cells 102, signals may be received from the horizontal lines from the plurality of inputs 106. These horizontal lines may act as a word line in a traditional memory array. The bit lines may run in a perpendicular direction and connect to the output neurons 104. Therefore, applying a voltage between a single one input of the word lines and a single input of the bit lines may cause voltage to be applied across a single one of the memory cells 102 representing synapses. This process can be used to select a single one of the memory cells 102 for a read and/or write operation.

FIG. 1 illustrates a detailed view of a single memory cell 102*b*. This memory cell 102*b* uses a word line 114 and a bit line 116 coupled to a select element 110 and a memory element 112. To minimize the leakage current through the circuit network 100, and to isolate memory elements connected on the same word/bit lines, the memory cell 102*b* may include the select element 110. The select element 110 may be implemented between the memory element 112 and the word line 114. The select element 110 may be used to reduce current from leaking through an individual memory cell 102*b* and reduce the leakage and power dissipation of the whole array, as well as to prevent disturbances while a memory cell that is passively addressed to access a memory cell on the same bitline/wordline (unless a desired memory cell is selected at a sufficient voltage above the select element threshold received by the memory cell 102*b*). Therefore, when the voltage is applied to the word line 114 and the bit line 116, the memory cell 102*b* is accessed while the select elements in memory cell 102*a* and memory cell 102*c* may prevent their associated memory elements from being affected by the voltage on the shared bit line 116. Although not shown explicitly in FIG. 1, three-terminal selecting devices may also be used for the select elements, such as transistors, to form a 1T-1 Memory Element cell. Many different technologies may also be used to implement the memory element 112, such as PCMs (Phase Change Memory), oxide-resistive random-access memory (oxRAMs) or conductive-bridging memories (CBRAM), ReRAMs, RRAMs, ferroelectric RAMs (FeRAMs), among others.

The embodiments used herein are compatible with many different types of memory elements. For example, a ReRAM is a type of nonvolatile random-access memory (RAM) that operates by changing resistance across a dielectric solid-state material. A ReRAM device is often arranged with a control transistor in a 1 transistor-1 resistor (1T-1R) memory cell architecture. These memory cells may be used in many different applications, including traditional Von Neumann architectures. A Von Neumann architecture is a computer architecture that includes a processing unit with an arithmetic logic unit and processor registers, a control unit with an instruction register and a program counter, memories that store data and instructions, and/or input/output mechanisms. When a 1T-1R memory cell is used in a computer architecture, a filament may be formed between a pair of metal electrodes that causes the memory element to conduct in a relatively high-current state to represent a logic 1 value. This filament may be formed by generating a positive voltage pulse across the drain and source of the transistor. To reset the memory element, a negative voltage pulse may be applied to dissipate the filament and represent a logic 0 value with a relatively high resistance to current flowing across the device.

Figure 2:
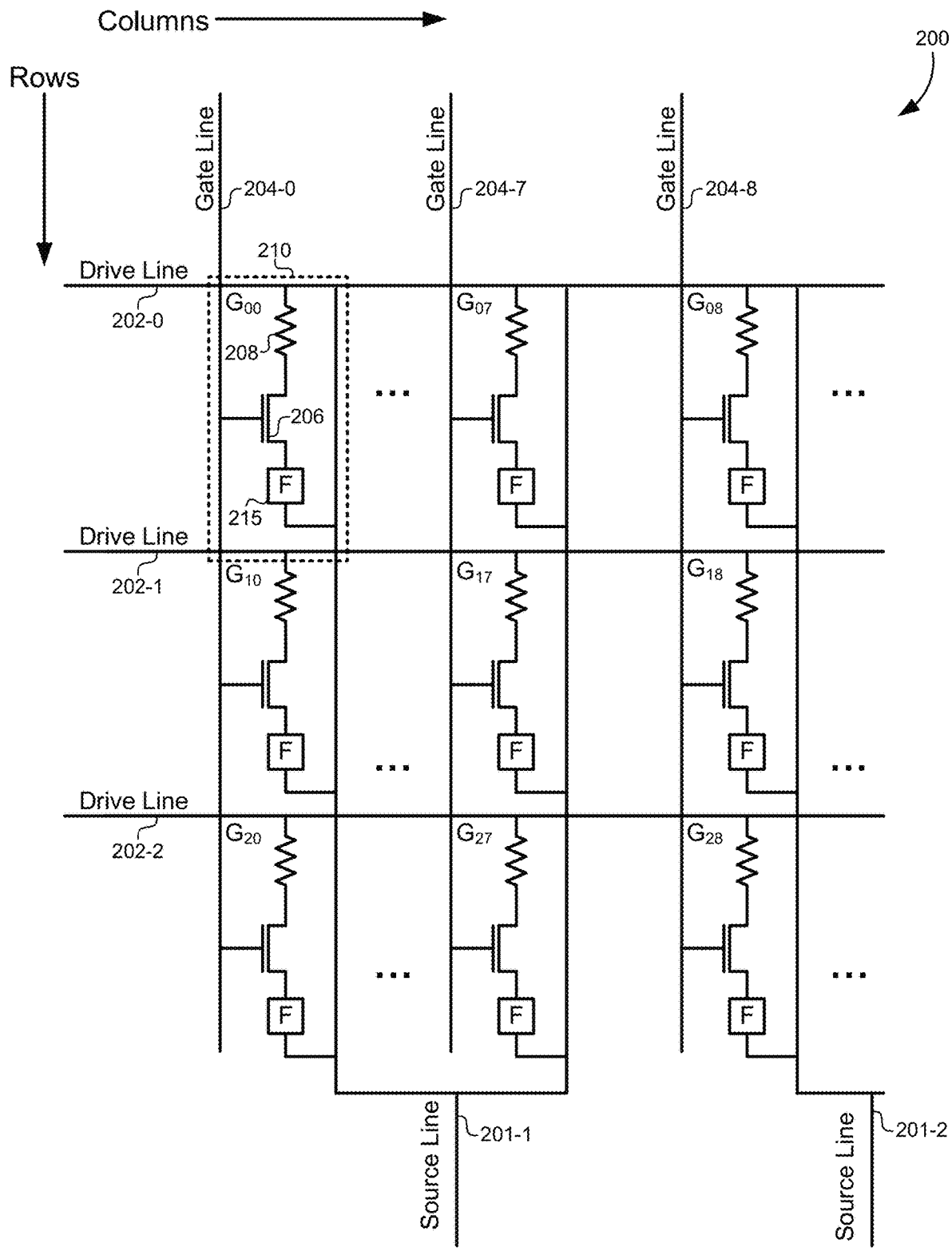
FIG. 2 illustrates a portion of a memory array with individual fuses in each of the memory cells, according to some embodiments.

FIG. 2 illustrates a portion of a memory array 200 with individual fuses in each of the memory cells, according to some embodiments. This portion of the memory array 200 illustrates three rows and three columns. However, it should be understood that the memory array 200 may be much larger, and may have N rows and M columns, where N and M are integer values greater than three. For example, the memory array 200 may include sizes such as 128×128, with 16 groups of eight columns tied together at the source line nodes. The visible portion of the memory array 200 is shown in FIG. 2 in isolation for the sake of clarity and to illustrate operations that may be carried out on individual memory cells. Therefore, the arrangement and size of the memory array 200 is provided only by way of example and is not meant to be limiting.

The memory array 200 may include a plurality of memory cells, such as memory cell 210. Each memory cell in the plurality of memory cells may include a select element and a memory element. The select element may allow current to flow through the memory element when corresponding signals are provided on a drive line 202, a gate line 204, and/or a source line 201. In this example, the select element may implemented using a MOS transistor 206. The memory element may be implemented using a resistive memory element 208 (e.g. a ReRAM device). Thus, the memory cell 210 may be an example of a 1T-1R memory cell. Other embodiments may use different devices to implement the select element and/or the memory element. For example, other embodiments may implement the memory element using a PCM device, a RRAM device, and/or the like, and other embodiments may implement the select element using multiple transistors. Therefore, the specific transistor 206 and resistive memory element 208 are provided only by way of example and are not meant to be limiting.

In this example, the source lines 201 may be connected to the source of the transistors in each column, including transistor 206. Some embodiments may tie the source lines 201 together as illustrated in FIG. 2. In addition to the source lines 201, gate lines 204 may be tied to the gates of the transistors to control the gate voltage and cause the transistors to conduct. Drive lines 202 may be connected to a first electrode of the memory element, such as the resistive memory element 208. The second electrode of the memory element may be connected to the drains of the transistors. The drive lines 202 may cross the memory array 200 horizontally as illustrated in FIG. 2.

In addition to the memory element and the select element in the memory cell 210, the embodiments described herein may add a fuse 215 to the memory cell 210. Traditional memory cells in large-scale memory arrays have not included individual fuses in each of the memory cells throughout the memory array. As the size of traditional fuses or OTP devices decrease, the reliability of these devices also decreases dramatically. Additionally, relatively large currents and voltages were required to program/blow traditional fuses or OTP devices. Thus, both the size and the power requirements of traditional fuses have prevented their use in individual memory cells in a memory array. The embodiments described herein solve these technical problems by using fuse designs that can be fabricated at the same 20-100 nm scale as the memory elements in a large memory array. These specific fuse embodiments are described in greater detail below.

The fuse 215 may be placed in series with the memory element and the select element as illustrated in FIG. 2. For example, the fuse 215 may be connected to a source of the MOS transistor 206. However, other embodiments may connect the fuse 215 to a drain of the MOS transistor 206 between the memory element and the select element. Other embodiments may alternatively connect the fuse 215 between the memory element and the drive line 202-0. Thus, any series connection of the fuse 215 to the memory cell may be used.

The fuse 215 may be configured to conduct currents that are normally present in the memory array 200. However, when an abnormally high voltage is applied across the fuse 215 or an abnormally high current flows through the fuse 215, the fuse may "blow" or be programmed to a nonconductive, high-resistance state. The precise current/voltage requirements for the fuse 215 may depend on each implementation of the memory array 200. The fuse embodiments described below describe how to size the circuit elements of the fuse 215 to adjust the threshold voltage/current.

FIG. 3A illustrates a traditional memory array 301 with defective memory cells, according to some embodiments. To illustrate the advantages provided by adding a fuse to individual memory cells in a memory array, a situation should be considered where individual memory cells become defective. Defects in individual memory cells may result from the manufacturing process, as well as from adverse operating conditions during use. For example, a defect in the memory cell may result from a nonuniform plasma or deposition process during the manufacturing process. A defect in the memory cell may also result from a static discharge or other high current/voltage anomaly that is experienced during the use of the memory array. Regardless of the cause, defects in the memory array may cause the memory element and/or select element in the memory cell to become a short-circuit.

The memory array 301 in FIG. 3A includes a number of defective memory cells. These memory cells are indicated with an "X" in the memory array 301. In some embodiments of the memory array 301, a single defective memory cell may cause additional memory cells in the memory array 301 to also become nonoperative. For example, a short circuit in a single memory cell of some memory arrays may cause an entire column of memory cells to become nonoperative. This effect is illustrated in FIG. 3A, where the memory columns rendered nonoperative by the defective memory cells are indicated with a light color, and the remaining functioning memory columns are indicated with a dark color.

FIG. 3B illustrates a memory array 303 where fuses are included in the individual memory cells, according to some embodiments. When a short-circuit occurs in the memory element and/or the select element, the fuse in that individual memory cell can be programmed or "blown" such that it enters a high-resistance, largely nonconductive state. The open circuit caused by the fuse effectively counteracts the short-circuit in the defective memory cell. This allows the other memory cells in the same memory column to remain operational without being affected by the defective memory cell. This effect is illustrated in FIG. 3B, where the only memory cells affected by the defective memory cells are the defective memory cells themselves. All other memory cells in the same columns and elsewhere as indicated with the dark color continue to function properly. Therefore, the fuses provided in the individual memory cells may increase the yield of the memory array during the manufacturing process, as well as minimize problems during later operation of the memory array after it has been deployed.

This disclosure describes a number of different implementations that have been developed to provide OTP devices as fuses that can be manufactured on a small enough scale to be used in individual memory cells in memory arrays while still maintaining a very high level of reliability over time. Note that the memory cells that include fuses described above need not be limited to the specific fuse embodiments described herein. Additionally, the fuse embodiments described below can be used in other applications aside from memory arrays. For example, the fuse embodiments may be useful in any nm-scale process with low-power requirements. Therefore, these fuse embodiments are not limited to use in a memory array, and the memory cells are not limited to the specific fuse embodiments described herein.

Figure 4:
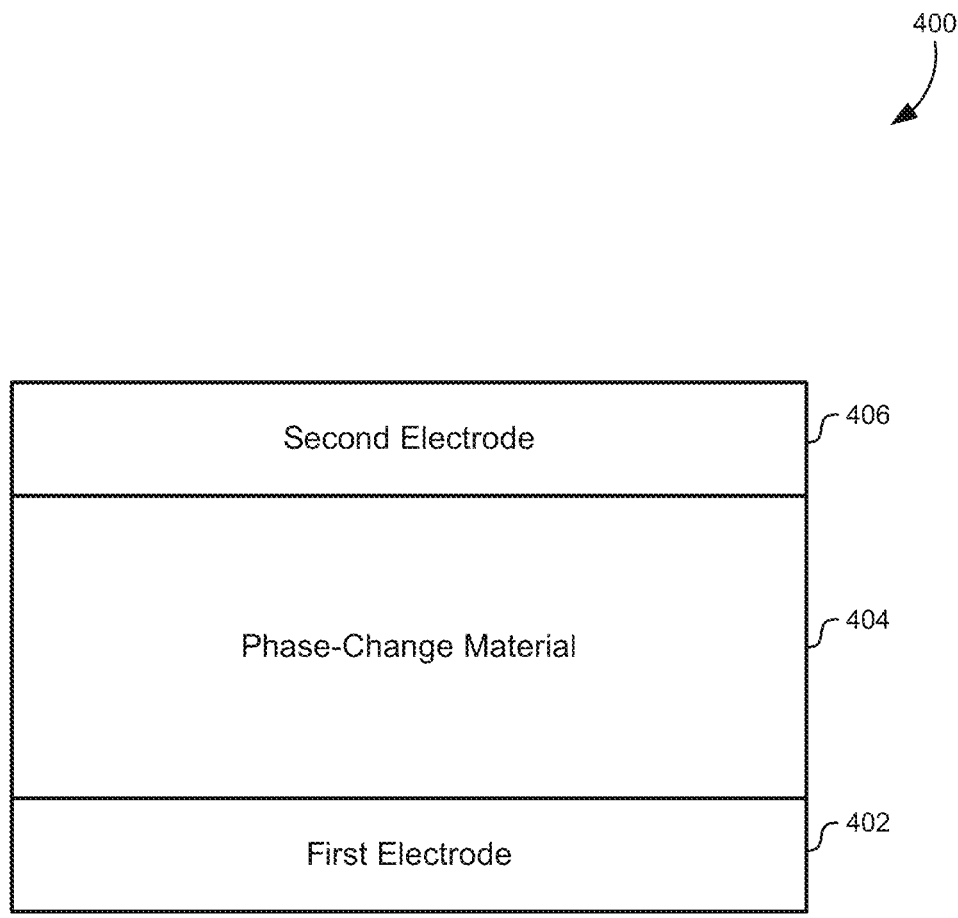
FIG. 4 illustrates a first step in a process for manufacturing a two-terminal, OTP device 400, according to some embodiments.

FIG. 4 illustrates a first step in a process for manufacturing a two-terminal, OTP device 400, according to some embodiments. This OTP device 400 may function as a fuse in an individual memory cell as described above. This OTP device 400 may also be used in other integrated circuit applications. This process for manufacturing the OTP device 400 is provided only by way of example and is not meant to be limiting. Other processes, steps, and techniques may be used to form the OTP device 400, and thus the OTP device 400 itself should not be limited by any specific manufacturing process unless explicitly claimed as such.

The OTP device 400 may include a first electrode 402. The first electrode 402 may include any metal, such as titanium, titanium nitride, platinum, tungsten, aluminum, and so forth. The first electrode 402 may be formed as a layer in a semiconductor process using any available method of depositing metal on a substrate. The (horizontal) width of the first electrode and the OTP device 400 as a whole may be between approximately 20 nm-100 nm, making this OTP device considerably smaller than other fuses with high reliability.

The OTP device 400 may also include a phase change material layer 404. A phase change material (PCM) is a substance that releases and/or absorbs energy to generate phase transitions. For example, some PCMs used in the OTP device 400 may transition between crystalline and noncrystalline structures, such that annealing the PCM layer 404 may cause the PCM layer 404 to crystallize and become conductive. Conversely, applying a large voltage/current to a crystalline PCM layer 404 may cause the PCM layer 404 to "shatter" or become amorphous, thereby losing the crystalline structure and becoming nonconductive. The PCM layer 404 may include any type of phase change material without limitation. For example some embodiments may use a chalcogenide material, such as any composition or mixture of Germanium-Antimony-Telluride (GST).

The OTP device 400 may include a second electrode 406. Like the first electrode 402, the second electrode 406 may include any metal, such as titanium nitride, platinum, tungsten, aluminum, and so forth. The second electrode 406 may be formed as a layer in a semiconductor process using any available method of depositing metal on a substrate (e.g., deposition, sputtering, etc.). The PCM layer 404 may be formed between the first electrode 402 and the second electrode 406. Note that the terms "first" and "second" are used merely to distinguish the two electrodes 402, 406 from each other. These terms do not imply any functional attribute, order, importance, or other characteristic of the electrodes 402, 406.

Figure 5:
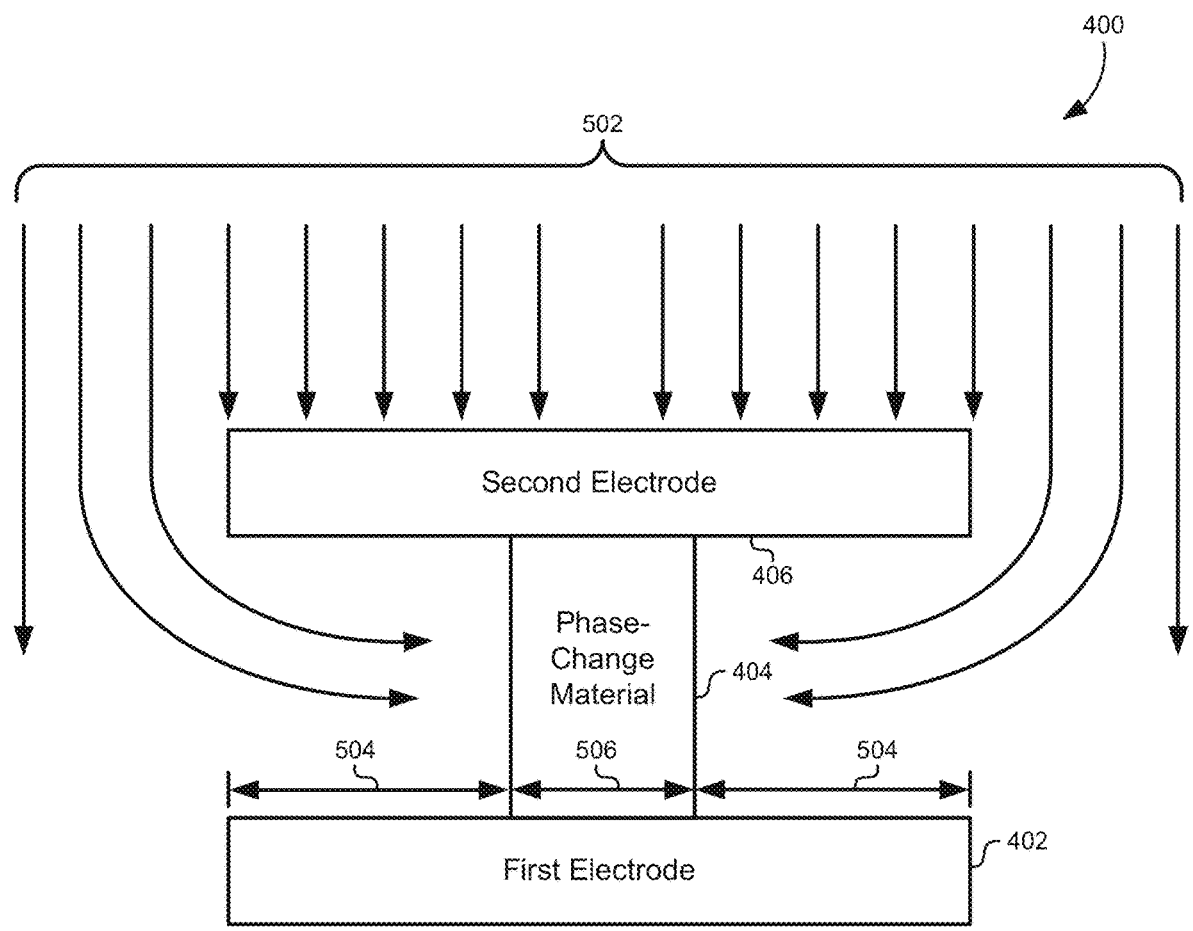
FIG. 5 illustrates a process for etching the PCM layer in the OTP device, according to some embodiments.

FIG. 5 illustrates a process for etching the PCM layer 404 in the OTP device 400, according to some embodiments. Any available etching process may be used. For example, a chemical etch process 502 may be configured to preferentially etch the PCM layer 404. The chemical etch process 502 may allow the chemical etch to etch away the PCM layer 404 underneath the second electrode 406. This may cause the width 506 of the PCM layer 404 to shrink such that the width 506 of the PCM layer 404 is less than the width of the first electrode 402 and the second electrode 406. The selectively etched PCM layer 404 may form a conductive filament. As described further below, this conductive filament may disperse within the cavity upon application of a threshold voltage/current.

The (horizontal) width and/or (vertical) thickness of the PCM layer 404 may determine the threshold voltage/current for the OTP device 400. As used herein, the width 506 may be measured horizontally as illustrated in FIG. 5, and may correspond to a surface area of the PCM layer 404. In contrast, the thickness may be a vertical distance between the first electrode 402 and the second electrode 406. A circuit designer may control the time of the chemical etch process 502 such that the width/length ratio of the PCM layer 404 produces the desired threshold voltage/current for the OTP device 400. Generally, increasing the width 506 and/or decreasing the thickness will increase the threshold voltage/current for the OTP device 400. Decreasing the width 506 and/or increasing the thickness may decrease the threshold voltage/current for the OTP device 400.

Note that etching underneath the second electrode 406 is typically discouraged in other semiconductor processes. This results in cavities in semiconductor devices and decreases the interface between adjacent layers in the semiconductor stack. For example, when forming a PCM memory element, etch processes are either not used or specifically timed to prevent etching away the PCM material under the electrodes. Therefore, these embodiments use a process that is different and contrary to the etch process used in other devices.

As described below, shrinking the width 506 of the PCM layer 404 may form a cavity between the first electrode 402 and the second electrode 406 that is not filled with the PCM layer 404. This cavity may be configured to prevent the PCM layer 404 from being able to reform or recrystallize once the threshold voltage/current is exceeded and the fuse is blown. Therefore, some embodiments may ensure that the resulting cavity is sufficiently large by specifying that the PCM layer 404 be etched until the width 506 is less than the distance 504 between the PCM layer 404 and the edge of the first electrode 402 and/or second electrode 406 (i.e., the isolator material described below). Stated another way, the PCM layer 404 may be etched until it occupies less than one third of the total width of the first electrode 402 and/or the second electrode 406. Some embodiments may use smaller cavities, and the width 506 of the PCM layer 404 may occupy less than one half of the total width of the first electrode 402 and/or the second electrode 406.

Figure 6:
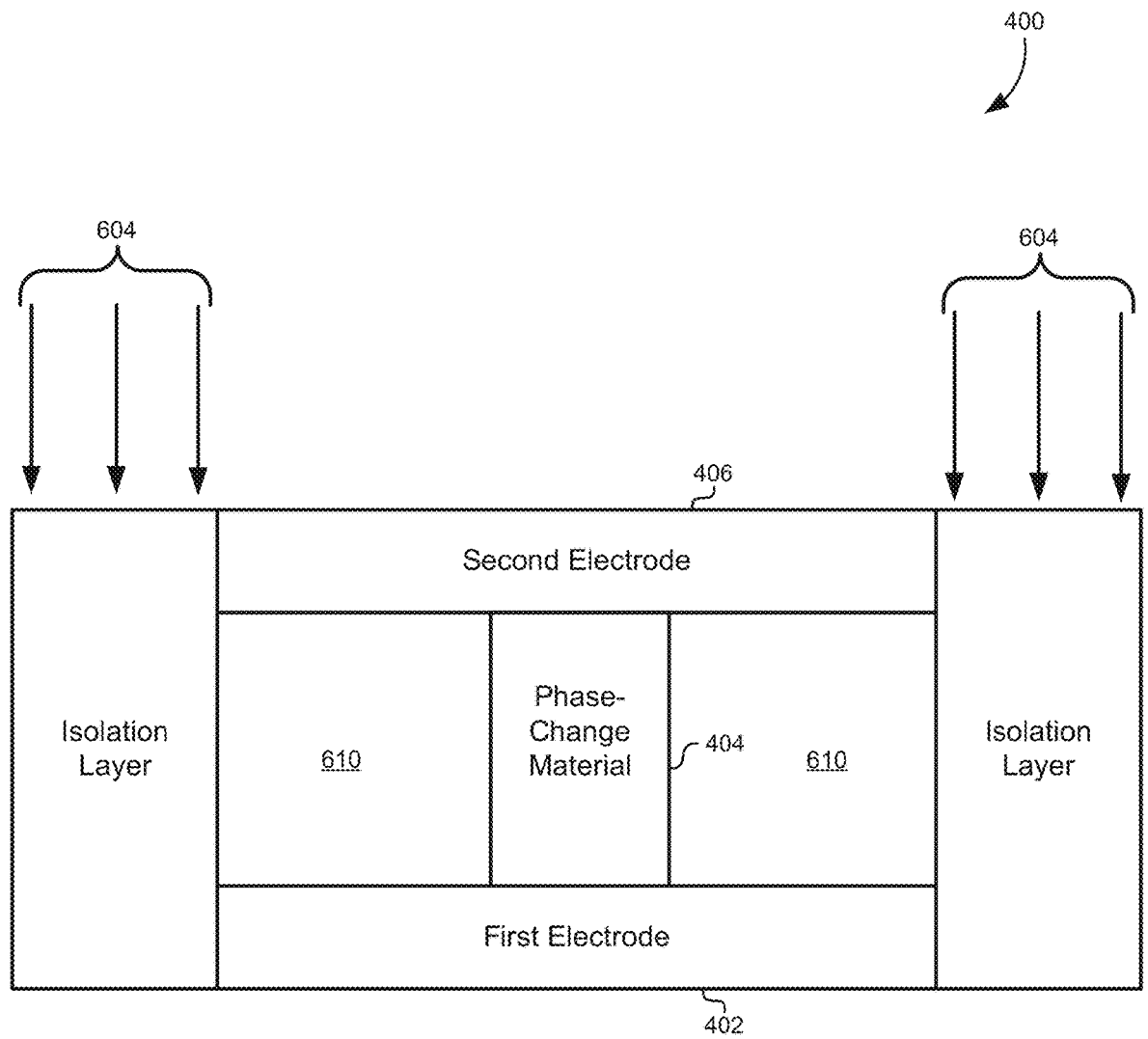
FIG. 6 illustrates an isolation layer that is used to generate a cavity in the OTP device, according to some embodiments.

FIG. 6 illustrates an isolation layer 604 that is used to generate a cavity 610 in the OTP device 400, according to some embodiments. The isolation layer 604 may be deposited using a gap-fill process, such as chemical vapor deposition (CVD). The CVD process may be used specifically because the isolation layer 604 may be deposited relatively quickly. Slower processes may allow the isolation layer 604 to grow beneath the second electrode 406 and fill the cavity 610. As illustrated in FIG. 6, the OTP device 400 ideally includes an isolation layer 604 that is formed fast enough to maintain the cavity 610.

The isolation layer 604 may be formed using any isolator or electrical insulating material. For example, some embodiments may use any type of oxide, as well as materials such as silicon oxide, silicon nitride, silicon oxycarbide, and other similar materials.

FIG. 6 shows a cross-sectional view of the OTP device 400. The isolation layer 604 may be deposited in a trench that is formed around the first electrode 402 and the second electrode 406. This trench may be etched during the chemical etch process described above or during another stage of the manufacturing process. Thus it should be understood that the isolation layer 604 may wrap around the second electrode 406, the selectively etched PCM layer 404, and/or the first electrode 402.

The isolation layer 604 may form a cavity between the isolator material and the PCM layer 404 horizontally, and between the second electrode 406 and the first electrode 402 vertically. The PCM layer 404 may form a vertical filament between the second electrode 406 and the first electrode 402 that is approximately centered in the cavity 610. In order for the OTP device 400 to be one-time programmable, the volume of the filament formed by the PCM layer 404 may be sized relative to the volume of the cavity 610. For example, some embodiments may require the volume of the PCM layer 404 to be less than the volume of the surrounding cavity 610. Some embodiments may require the volume of the PCM layer 404 to be less than 75% of the volume of the cavity 610. The specific ratio of these volumes may depend on the requirements of each individual circuit in which the OTP device 400 is used, and thus the sizes may be adjusted as needed in various embodiments to meet different voltage/current requirements.

In some embodiments, the PCM layer 404 may be subjected to an annealing process. The energy from the annealing process may cause the PCM layer 404 to enter a crystalline state. For example, when the PCM material is deposited, it may be in an amorphous state. The annealing process may crystallize the PCM layer 404 such that it becomes conductive. In some embodiments, the specific type of PCM used may have a crystallization temperature that is below the back-end-of-line (BEOL) maximum temperatures used for the overall semiconductor structure of which the OTP device 400 is a part. For example, some embodiments may use a PCM layer having a crystallization temperature of less than approximately 450° C., as the semiconductor substrate may be subjected to temperatures in this range without damage.

Figure 7:
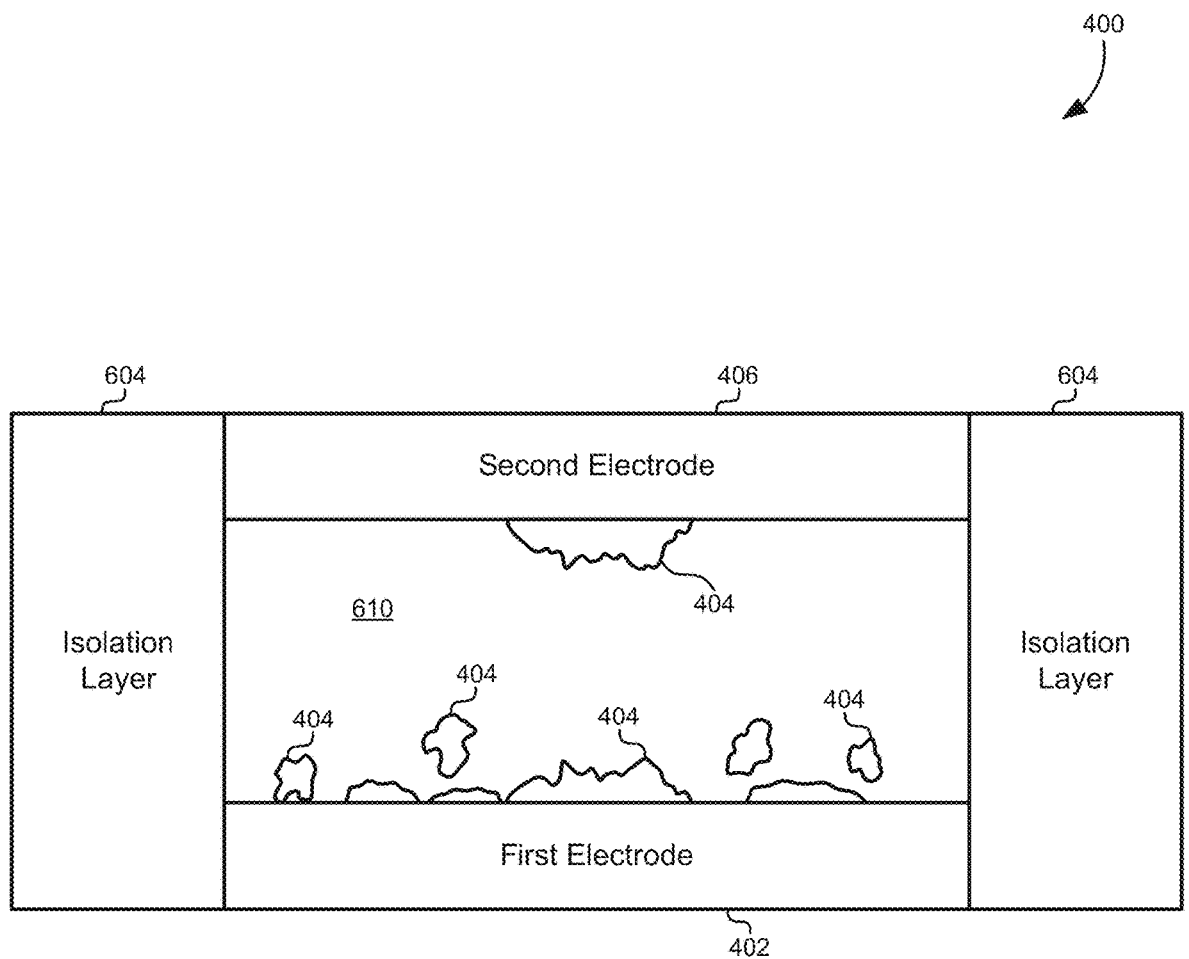
FIG. 7 illustrates the operation of the OTP device after a threshold voltage/current is applied, according to some embodiments.

FIG. 7 illustrates the operation of the OTP device 400 after a threshold voltage/current is applied, according to some embodiments. As described above, the threshold voltage/current may be determined by the relative width and thickness of the PCM layer 404. The threshold voltage/current may be specified in terms of an amount of power or energy that may be absorbed by the PCM layer 404 before absorbing enough energy to undergo a phase change. When the threshold is exceeded, the PCM layer 404 may break the crystalline structure and become amorphous ("shattered"). As illustrated in FIG. 7, fragments of the PCM layer 404 may be distributed throughout the cavity 610, or the amorphous PCM layer 404 may be distributed along the edges of the cavity 610. When the PCM layer 404 no longer forms a filament connection between the first electrode 402 and the second electrode 406, the PCM material may disperse within the cavity and as a result the OTP device 400 may increase its resistance and become relatively nonconductive. This may correspond to a blown fuse condition or a programmed OTP device 400.

In a normal PCM device, a stimulus may be provided to the PCM layer 404 causing the PCM layer 404 to re-crystallize and become conductive again. However, because the cavity 610 is formed around the PCM layer 404, the fragments of the PCM layer 404 are distributed or dispersed around the cavity 610. Applying a stimulus to the OTP device 400 in an attempt to reform the crystalline structure of the PCM layer 404 is ineffective because the PCM layer 404 is distributed around the cavity 610 and is unable to form a crystalline structure. This allows the PCM layer 404 to act as a one-time programmable device instead of a resettable filament.

Figure 8:
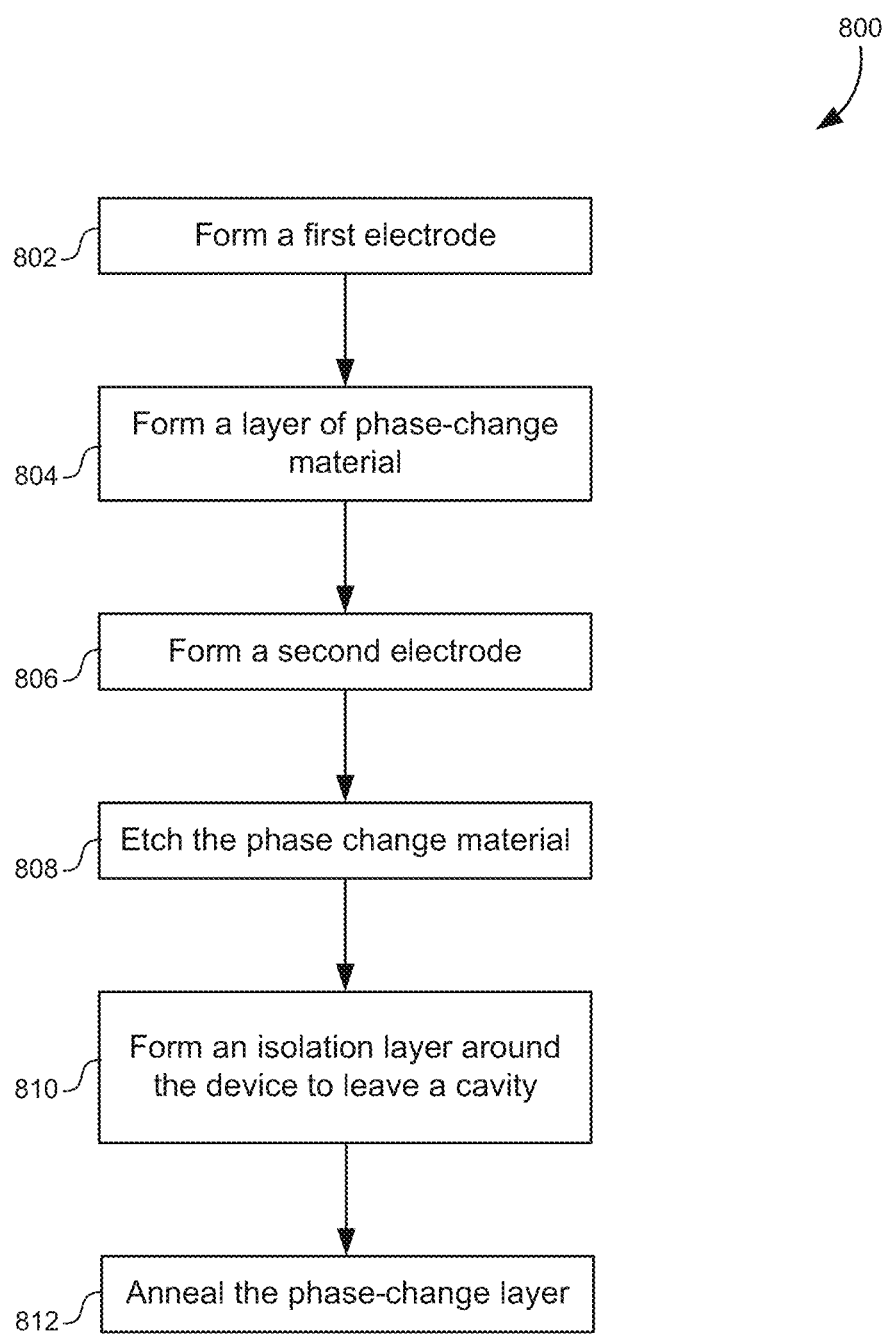
FIG. 8 illustrates a flowchart of a method for forming an OTP device using a PCM layer, according to some embodiments.

FIG. 8 illustrates a flowchart 800 of a method for forming an OTP device using a PCM layer, according to some embodiments. This method may be carried out by one or more semiconductor processing machines or chambers, such as etch chambers, deposition chambers, polishing chambers, and so forth. These steps may be carried out using the process as described in detail above in FIGS. 4-7.

The method may include forming a first electrode (802). The method may also include forming a PCM layer on top of the first electrode (804), and forming a second electrode on top of the PCM layer (806). Note that additional layers of other materials may be formed between the first/second electrodes and the PCM layer without restriction. The method may also include etching the PCM layer (808). As described above, a selective etch, such as a chemical etch may be used to etch the PCM layer from beneath the second electrode to form a cavity between the first/second electrodes. The method may further include forming isolation layer around the device to create a cavity inside the first/second electrodes, the PCM layer, and the isolation layer. In some embodiments, the PCM layer may be subjected to an annealing process to cause the PCM layer to crystallize (812).

It should be appreciated that the specific steps illustrated in FIG. 8 provide particular methods of manufacturing an OTP device according to various embodiments. Other sequences of steps may also be performed according to alternative embodiments. For example, alternative embodiments may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. Many variations, modifications, and alternatives also fall within the scope of this disclosure.

Figure 9:
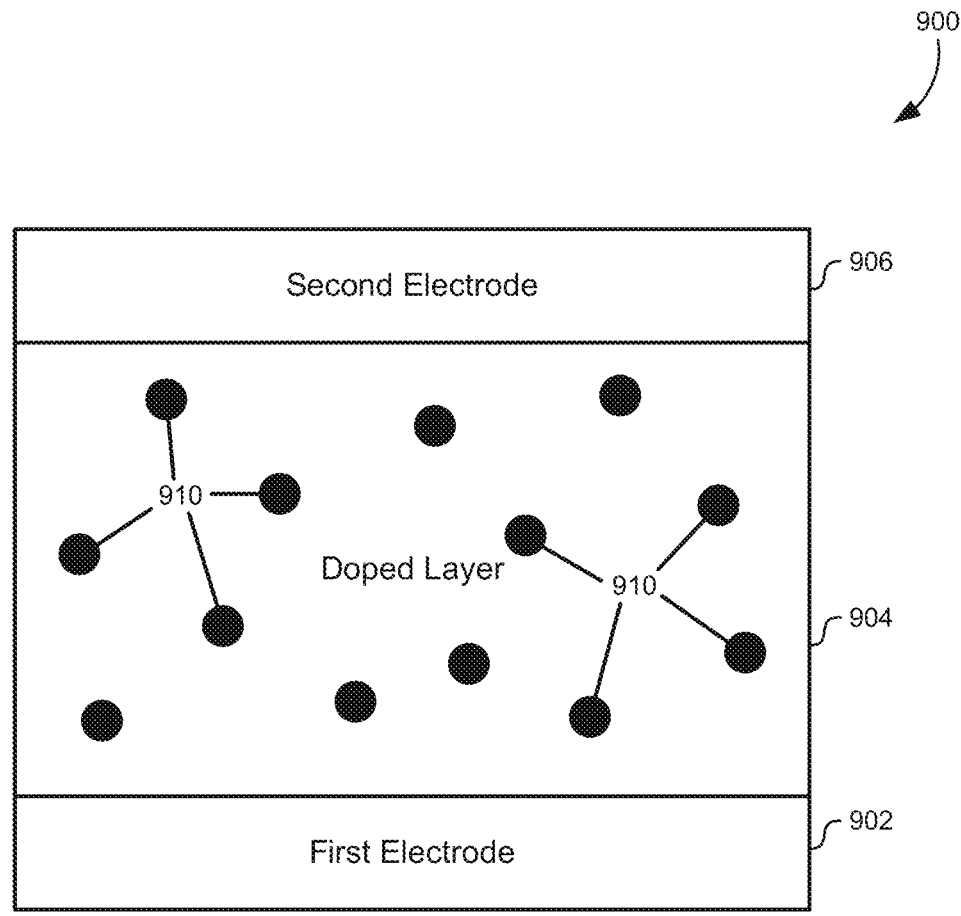
FIG. 9 illustrates an OTP device using a doped material between the electrodes, according to some embodiments.

FIG. 9 illustrates an OTP device 900 using a doped material between the electrodes, according to some embodiments. This OTP device 900 represents an alternative to the OTP device 400 described above. This OTP device 900 may also be used in individual memory cells, neural networks, or any other semiconductor circuit application.

The OTP device 900 may include a first electrode 902 and a second electrode 906. These electrodes 902, 906 may use materials and be formed as described above for the OTP device 400. A doped layer 904 may be formed between the first electrode 902 and the second electrode 906. The doped layer 904 may be formed using, for example, an oxide material. Some embodiments may also use a chalcogenide material. The doped layer 904 may then be doped with any highly mobile ion. For example, metallic ions may be used such as copper ions or silver ions. These mobile ions may be characterized by moving when an electric field is applied to the OTP device 900.

The OTP device 900 may be used in a conductive state as depicted in FIG. 9. For example, the ions 910 in the doped layer 904 may act as carriers that allow current to flow between the second electrode 906 and the first electrode 902. In some embodiments, the ions 910 may be evenly distributed within the doped layer 904. Under normal operating conditions, the ions 910 may remain relatively stationary and not move in response to electric fields and applied voltages within a normal operating range. For example, normal operating voltages/currents in a neural network or memory array may generate electric fields across the OTP device 900 that are insufficient to significantly move the ions 910 through the lattice of the doped layer 904.

Figure 10:
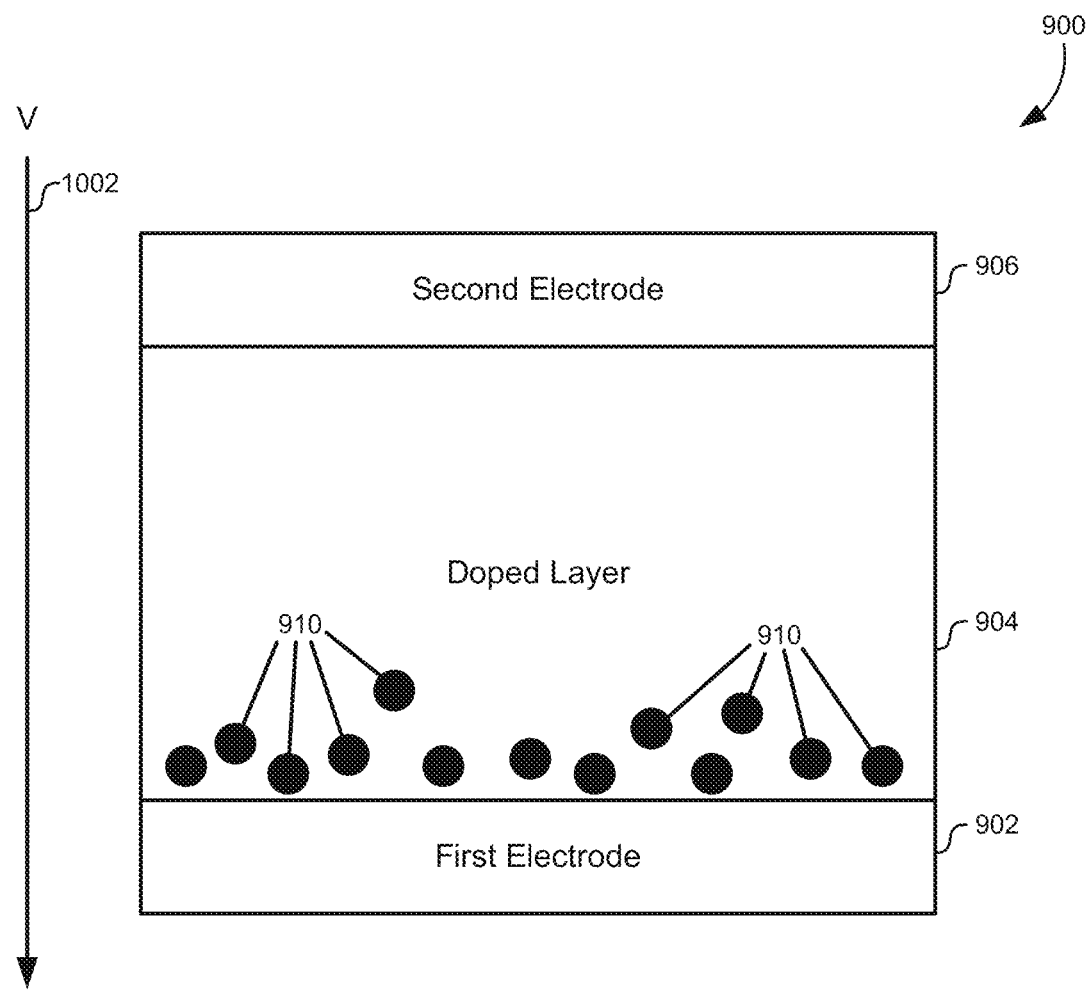
FIG. 10 illustrates the OTP device in a nonconductive state, according to some embodiments.

FIG. 10 illustrates the OTP device 900 in a nonconductive state, according to some embodiments. When subjected to an electric field that is higher than the specified operating range (e.g., above a threshold voltage), the electric field may be sufficient to move the ions through the doped layer 904 towards one of the two electrodes 902, 906. In this example, a voltage 1002 applied to the OTP device 900 exceeds a threshold voltage, and the resulting electric field across the OTP device 900 is sufficient to move the ions 910 toward the first electrode 902. Since the ions 910 are no longer distributed throughout the doped layer 904 and are instead concentrated near the first electrode 902 in response to the previous application of the voltage or electric field, the doped layer greatly increases its resistance and becomes largely nonconductive. Thus, this electric field outside of the normal operating range may cause the OTP device 900 to act as a "blown" fuse or open circuit.

Although the OTP device 900 may be subjected to some conditions that cause the ions 906 to be moved back towards the second electrode 906, these conditions would be well outside of any normal (or even abnormal) operating range of a circuit in which the OTP device 900 is used as a fuse. For example, because the doped layer 904 is no longer conductive, it would take a very large opposing voltage in order to move the ions 910 back towards their original positions. These voltages would not be present in even adverse operating conditions of most applications, such as neural networks or memory arrays. Thus, the movement of the ions 910 towards the first electrode 902 may be considered a permanent condition that programs the OTP device 900 into an open, high-resistance state.

Figure 11:
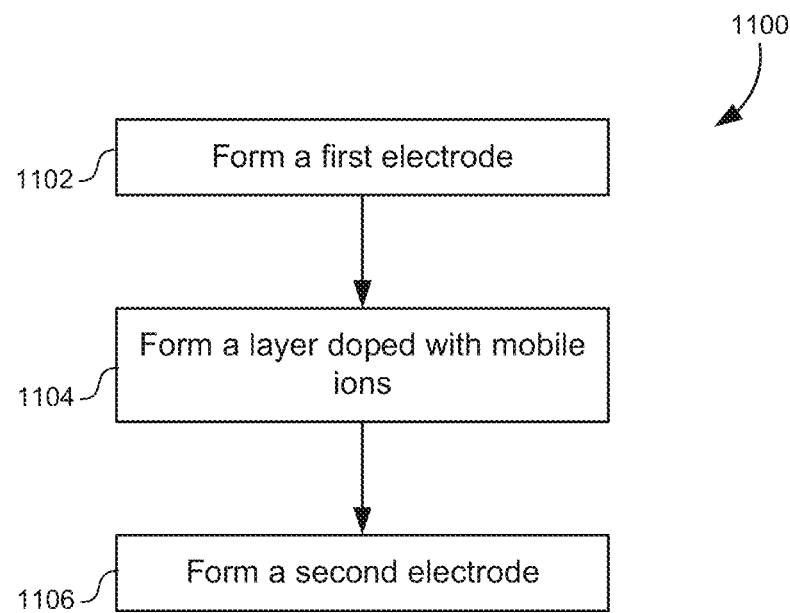
FIG. 11 illustrates a flowchart of a method for forming an OTP device using a doped layer, according to some embodiments.

FIG. 11 illustrates a flowchart 1100 of a method for forming an OTP device using a doped layer, according to some embodiments. This method may be carried out by one or more semiconductor processing machines or chambers, such as etch chambers, deposition chambers, polishing chambers, and so forth. The method may include forming a first electrode (1102). The method may also include forming a doped layer that is doped with mobile ions on top of the first electrode (1104), and forming a second electrode on top of the doped layer (1106). Note that additional layers of other materials may be formed between the first/second electrodes and the doped layer without restriction. The doped layer may be formed by depositing a layer of material on the second electrode and implanting ions in the material.

It should be appreciated that the specific steps illustrated in FIG. 11 provide particular methods of manufacturing an OTP device according to various embodiments. Other sequences of steps may also be performed according to alternative embodiments. For example, alternative embodiments may perform the steps outlined above in a different order. Moreover, the individual steps illustrated in FIG. 11 may include multiple sub-steps that may be performed in various sequences as appropriate to the individual step. Furthermore, additional steps may be added or removed depending on the particular applications. Many variations, modifications, and alternatives also fall within the scope of this disclosure.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A memory cell in a memory array, the memory cell comprising:
   a memory element configured to store a value;
   a select element in series with the memory element configured to receive a select signal for the memory cell to read and write the memory element; and
   a one-time programmable fuse in series with the memory element or the select element, wherein the fuse is configured to conduct during read and write operations of the memory element, and the fuse configured to blow when the memory element fails as a short circuit.

2. The memory cell of claim 1, wherein the fuse is configured to generate an open circuit in response to a short circuit in the select element or the memory element.

3. The memory cell of claim 1, wherein the memory array comprises a plurality of memory cells, and each of the plurality of memory cells comprises one-time programmable fuses.

4. The memory cell of claim 1, wherein the memory element comprises a defect causing the memory element to short-circuit, and other memory elements in a same memory column of the memory array remain operational.

5. The memory cell of claim 1, wherein the fuse is between approximately 20 nm to 100 nm wide.

6. A two-terminal, one-time programmable fuse comprising:
   a first electrode;
   a second electrode;
   an isolator material formed around the first electrode and the second electrode; and
   a phase-change material (PCM) layer between the first electrode and the second electrode, wherein a width of the PCM layer is less than a width of the first electrode and the second electrode such that an empty cavity is formed between the isolator material and the PCM layer between the first electrode and the second electrode.

7. The fuse of claim 6, wherein the PCM layer comprises a chalcogenide material.

8. The fuse of claim 7, wherein the chalcogenide material comprises a composition of Germanium-Antimony-Telluride.

9. The fuse of claim 6, wherein a width of the PCM layer is less than a distance between the PCM layer and the isolator material.

10. The fuse of claim 6, wherein the isolator material comprises an oxide.

11. The fuse of claim 6, wherein the PCM material comprises a selectively-etched PCM material underneath the second electrode.

12. The fuse of claim 6, wherein the PCM material comprises a crystalline structure that forms a conductive filament between the first electrode and the second electrode.

13. The fuse of claim 12, wherein a width of the PCM material is sized based on a threshold voltage or current, such that the conductive filament will disperse within the cavity upon application of the threshold voltage or current.

14. A two-terminal, one-time programmable fuse comprising:
   a first electrode;
   a second electrode; and
   a doped material between the first electrode and the second electrode, wherein the doped material is doped with mobile ions that conduct current between the first electrode and the second electrode when the fuse is not blown, wherein the doped material is doped such that the mobile ions will be driven to the first electrode by a voltage sufficient to blow the fuse, and such that the mobile ions remain at the first electrode and the fuse acts as an open circuit after the voltage is removed and a range of normal operating voltages for programming an associated memory element are applied across the first and second electrode.

15. The fuse of claim 14, wherein the doped material comprises an oxide.

16. The fuse of claim 14, wherein the doped material comprises a chalcogenide material.

17. The fuse of claim 14, wherein the mobile ions comprise copper ions.

18. The fuse of claim 14, wherein the mobile ions are evenly distributed throughout the doped material before the fuse is blown.

19. The fuse of claim 14, wherein the mobile ions form a conductive pathway through the doped material before the fuse is blown.

20. The fuse of claim 14, wherein the mobile ions are concentrated near the first electrode in response to a previous application of an electric field after the fuse is blown.

* * * * *